(12) United States Patent
Hsiao et al.

(10) Patent No.: US 6,821,810 B1
(45) Date of Patent: Nov. 23, 2004

(54) HIGH TRANSMITTANCE OVERCOAT FOR OPTIMIZATION OF LONG FOCAL LENGTH MICROLENS ARRAYS IN SEMICONDUCTOR COLOR IMAGERS

(75) Inventors: Yu-Kung Hsiao, Tao-Yuan (TW); Sheng-Liang Pan, Hsin-Chu (TW); Bii-Juno Chang, Hsin-Chu (TW); Kuo-Liang Lu, Hsin-Chu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/633,644

(22) Filed: Aug. 7, 2000

(51) Int. Cl.[7] ...................... H01L 21/00; H01L 31/0203
(52) U.S. Cl. .............................. 438/69; 438/60; 438/70; 438/71; 438/72; 438/75; 257/432; 257/435; 257/436
(58) Field of Search ............................... 438/60, 69–72, 438/75–79, 144; 257/432, 435, 436, 437, 294

(56) References Cited

U.S. PATENT DOCUMENTS

| | | | | |
|---|---|---|---|---|
| 5,479,049 A | * | 12/1995 | Aoki et al. | 257/232 |
| 5,514,888 A | * | 5/1996 | Sano et al. | 257/232 |
| 5,672,519 A | | 9/1997 | Song et al. | 437/3 |
| 5,871,653 A | | 2/1999 | Ling | 216/2 |
| 6,001,540 A | | 12/1999 | Huang et al. | 430/321 |
| 6,040,591 A | * | 3/2000 | Otsuka | 257/232 |
| 6,127,668 A | * | 10/2000 | Baek | 250/208.1 |
| 6,133,954 A | * | 10/2000 | Jie et al. | 348/308 |

\* cited by examiner

Primary Examiner—Donghee Kang (57) ABSTRACT

A transmittance overcoat with effectively planar top surface and specified optical and materials properties is applied above a microlens layer to extend the focal length and enhance the performance of long focal length microlenses for semiconductor array color imaging devices. The geometrical optics design factors and microelectronic fabrication sequence to achieve optimized long focal length microlens performance are disclosed. The principal advantages of the adaptive process taught in the present invention is shown to enable real-time compensation adjustments for process and material variations. The overcoat process enables simplified single-layer integrated microlens optics for lowcost, high volume manufacturing of CMOS and CCD color video cameras.

18 Claims, 8 Drawing Sheets

160°THERMAL REFLOW 10 MIN

HIGH TRANSMITTANCE OVERCOAT FOR OPTIMIZATION OF LONG FOCAL LENGTH MICROLENS ARRAYS IN SEMICONDUCTOR COLOR IMAGERS

BACKGROUND OF THE INVENTION (1) Field of the Invention

The present invention relates to the optical design and microelectronic fabrication of high transmittance overcoat material(s) to increase focal length and optimize performance of long focal length microlens arrays in semiconductor color imagers.

(2) Description of Prior Art

Semiconductor array color image sensors for video cameras are conventionally comprised of complementary metal-oxide semiconductor (CMOS), charge-coupled devices (CCD), or, charge-injection devices (CID) integrated with optical structures consisting of planar arrays of microlenses, spacers, and primary color filters mutually aligned to an area array of photodiodes patterned onto a semiconductor substrate. The elementary unit of the imager is defined as a pixel, characterized as an addressable area element with intensity and chroma attributes related to the spectral signal contrast derived from the photon collection efficiency of the microlens array. The microlens on top of each pixel focuses light rays onto the photosensitive one of the pixel. The optical performance of semiconductor imaging arrays depends on pixel size and the geometrical optical design of the camera lens, microlenses, color filter combinations, spacers, and photodiode active area size and shape. The function of the microlens is to efficiently collect incident light falling within the acceptance cone and refract this light in an image formation process onto a focal plane at a depth defined by the planar array of photodiode elements. Significant depth of focus may be required to achieve high resolution images and superior spectral signal contrast since the typical configuration positions the microlens array at the top light collecting surface and the photosensors at the semiconductor substrate surface.

When a microlens element forms an image of an object passed by a video camera lens, the amount of radiant energy (light) collected is directly proportional to the area of the clear aperture, or entrance pupil, of the microlens. At the image falling on the photodiode active area, the illumination (energy per unit area) is inversely proportional to the image area over which the object light is spread. The aperture area is proportional to the square of the pupil diameter and the image area is proportional to the square of the image distance, or focal length. The ratio of the focal length to the clear aperture of the microlens is known in Optics as the relative aperture or f-number. The illumination in the image arriving at the plane of the photodetectors is inversely proportional to the square of the ratio of the focal length to clear aperture. An alternative description uses the definition that the numerical aperture (NA) of the lens is the reciprocal of twice the f-number. The concept of depth of focus is that there exists an acceptable range of blur (due to defocussing) that will not adversely affect the performance of the optical system.

The depth of focus is dependent on the wavelength of light, and, falls off inversely with the square of the numerical aperture. Truncation of illuminance patterns falling outside the microlens aperture results in diffractive spreading and clipping or vignetting, producing undesirable nonuniformities and a dark ring around the image.

The limiting numerical aperture or f-stop of the imaging camera's optical system is determined by the smallest aperture element in the convolution train. Typically, the microlens will be the limiting aperture in video camera systems. Prior Art is characterized by methods and structures to maximize the microlens aperture by increasing the radius of curvature, employing lens materials with increased refractive index, or, using compound lens arrangements to extend the focal plane deeper to match the multilayer span required to image light onto the buried photodiodes at the surface of the semiconductor substrate. Light falling between photodiode elements or on insensitive outer zones of the photodiodes, known as dead zones, may cause image smear or noise. With industry trends to increased miniaturization, smaller photodiodes are associated with decreasing manufacturing cost, and, similarly, mitigate against the extra steps of forming layers for Prior Art compound lens arrangements to gain increased focal length imaging. Since the microlens is aligned and matched in physical size to shrinking pixel sizes, larger microlens sizes are not a practical direction. Higher refractive index materials for the microlens would increase the reflection-loss at the air-microlens interface and result in decreased light collection efficiency and reduced spectral signal contrast or reduced signal-to-noise ratio. Limits to the numerical aperture value of the microlens are imposed by the inverse relationship of the depth of focus decreasing as the square of the numerical aperture, a strong quadratic sensitivity on the numerical aperture. For these physical reasons, microlens optical design properties need to be kept within practical value-windows to achieve engineering design objectives for spectral resolution and signal-to-noise.

The design challenge for creating superior solid-state color imagers is, therefore, to optimize spectral collection efficiency by a single microlens to maximize the fill-factor of the photosensor array elements with the minimum number of microelectronic fabrication process steps. The present invention is clearly distinguished from Prior Art by introducing a high transmittance overcoat to optimize long focal length single layer microlens performance without significant optoelectronic design changes.

Figure 1:
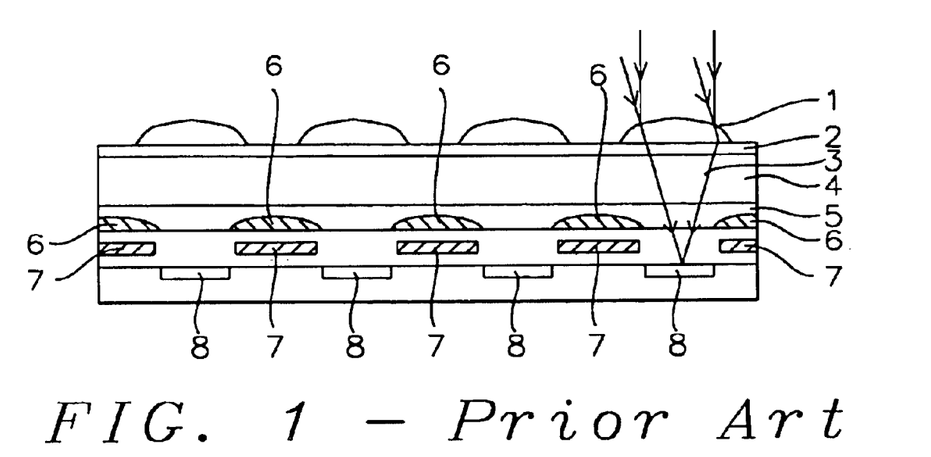
FIG. 1 is a simplified schematic cross-sectional profile of semiconductor and optical structures showing a typical order of elements of a conventional Prior Art device for color image formation.
Figure 2:
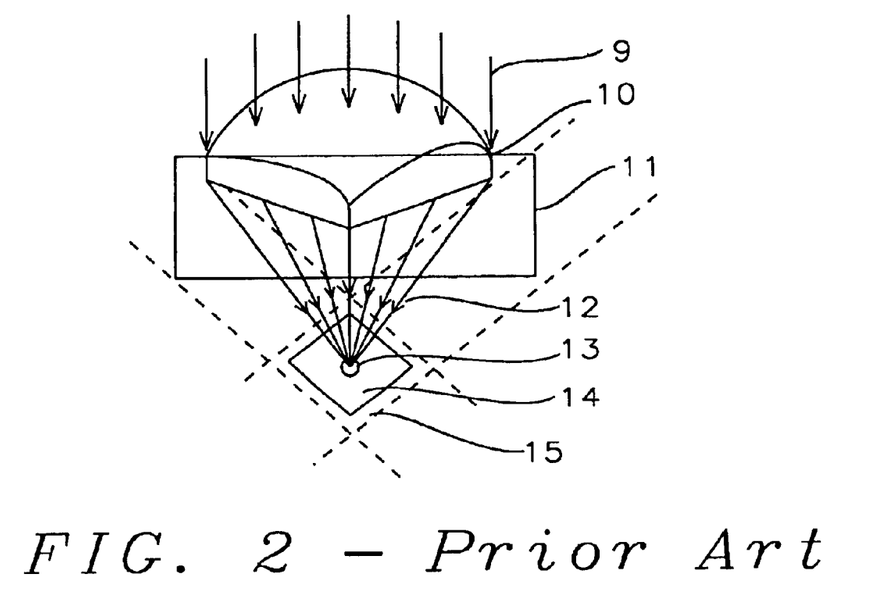
FIG. 2 illustrates the geometric optics factors for microlens imaging onto the photosensitive active one within a square pixel area.

FIG. 1 exhibits the conventional Prior Art vertical semiconductor cross-sectional profile and optical configuration for color image formation. Microlens 1 residing on a planarization layer which serves as a spacer 2 collects a bundle of light rays from the image presented to the video camera and converges the light into focal cone 3 onto photodiode 8 after passing through color filter 4 residing on planarization layer 5, passivation layer 6, and metallization layer 7. The purpose of the microlens' application in CCD and CMOS imaging devices is to increase imager sensing efficiency. FIG. 2 illustrates the geometrical optics for incident image light 9 converged by microlens element 10, color filter 11, into focal cone 12, to the focal area 13 within a photoactive area 14 surrounded by a dead or non-photosensitive area 15, wherein the sum of the areas of 14 and 15 comprise the region of the pixel.

Huang et al in U.S. Pat. No. 6,001,540 teaches an optical imaging array device with two principal process embodiments to form a biconvex microlens or a converted plano-convex microlens version. In the primary embodiment, a layer of silicon dioxide is deposited onto a substrate, followed by a deposition of polysilicon and a layer of silicon nitride. Patterning and etching the silicon nitride, a circular opening is formed and the exposed polysilicon is oxidized to form a lenticular body of silicon oxide. The surrounding silicon nitride is removed by etching to form a biconvex microlens. In the second method, a sequence of steps is employed wherein spin on glass is deposited to a thickness equal to half said lenticular body's thickness; a process is described and claimed for manufacturing a plano-convex microlens. In either embodiment, the top surface of the microlens is at an air interface with unit refractive index, n=1.0. Control of focal length is done by adjusting the thickness of a spacer layer on which the microlens is formed.

An alternative Prior Art approach to microlens formation for solid-state image sensors is provided by Song et al in U.S. Pat. No. 5,672,519. Song et al. teach an image sensor with a compound regular-shape microlens which extends conventional prior art from square to rectangular illuminance areas to account for CCD structures where the dimensions of a pixel or photodiode are different in the vertical and horizontal directions of the semiconductor. Song et al accomplish their extension of the prior art by two successive iterations of the conventional melt and flow process to cascade a contiguous upper lens of different curvature and/or refractive index on a first, lower lens to accommodate the dimensional mismatch of the pixel. The fabrication method consists of forming lens shapes by carrying out patterning of transparent photoresist having a refractive index of 1.6 and melting it to cause flow which, under surface tension, results in a mosaic of hemispherical convex lens array elements. Simple convex and compound convex lens classes representative of prior art are shown in FIG. 3(a), FIG. 3(b), and FIG. 3(c).

Figure 3A:
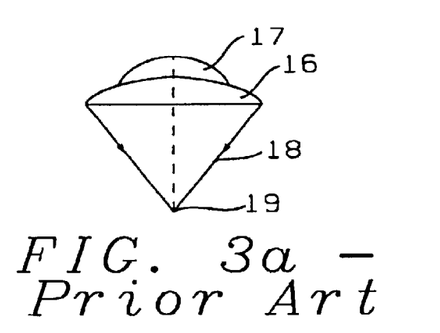
FIGS. 3(a), (b), (c) depicts the single compound lens configurations of Prior Art.
Figure 3B:
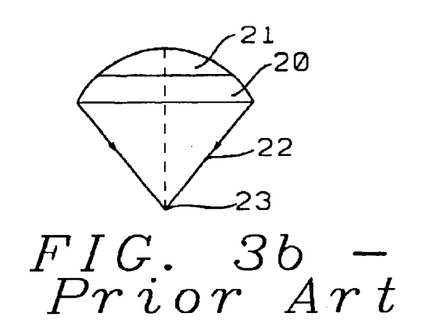
Figure 3C:
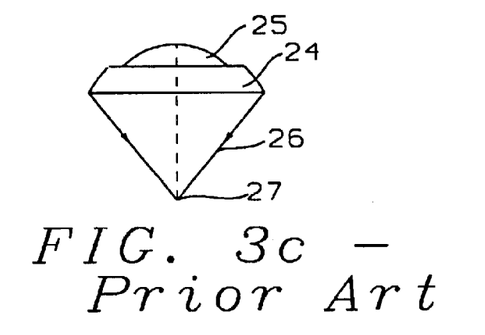

In FIG. 3(a), a first hemispherical microlens element 16 of a two-dimensional array of microlenses is formed in the manner described above. A successive polymer, resin, or photoresist film coating is conformally applied, photolithographically patterned, thermally reflowed and/or dry-etched. The second-layer photomask and thermal and surface tension conditions of the first microlens 16 array-plane determine the curvature and thickness of the second tandem microlens array-elements 17. The compound lens in FIG. 3(a) is shown comprised of first lens 16, second lens 17, forming light-cone 18 converging to focal point or area 19. FIG. 3(b) shows a planarized first lens 20 with second lens 21 forming a compound lens converging image light-cone 22 to focal area 23. In FIG. 3(c) first microlens 24 is again planarized but also faceted by etching, and second lens 25 is conventionally formed to comprise the compound lens to converge image light-cone 26 to focal area 27. Curvature control is difficult even for a single fabrication step, and, all the determinents of variance that apply to the single step apply a fortifier to the iterated process forming the compound lens. The final structure achieved by Song et al produces parallel stripes of microlenses across a base mosaic of microlenses which can be planarized to provide a flat surface for the second lens array-plane. In all cases of the Prior Art it is observed that single simple or single compound microlens arrays, with a mapping of the single microlens, simple or compound, is to a single pixel or single photodiode sensing area in the imager. The limiting numerical aperture or f-stop of the imaging camera's optical system is that of the smallest aperture element in the convolution train. Therefore, it is observed that the Prior Art represented in FIGS. 3(a) and 3(c) have in common the further limitation of the light collection capability of the larger numerical aperture first (lower) microlens element by the addition of the second tandem microlens element (upper) which preceeds it. Spherical aberrations, coma, light scattering, numerical aperture variations, vignetting, reflective losses at interfaces, multibounce stray light, cross-talk and other optical defects described by the modulation transfer function of the upper lenses are convolved with the lower or base lenses modulation transfer function having their own analogous set of defects. As in the case of Huang et al in U.S. Pat. No. 6,001,540, Song et al share the common problem that the microlens' top surface is at an air interface of unity refractive index, n=1.0, subjecting these patents to significant reflection loss at the microlens-air interface.

U.S. Pat. No. 5,871,653 to Ling addresses high volume, low cost manufacturing methods for the mass production of microlens array substrates for flat panel display applications. In particular, it is an object of Ling to provide fabrication methods of microlens arrays on transparent substrates such as glass and polymer for sandwiching a liquid crystal within a microlens array plate. This patent does not address the problem set associated with forming integrated microlens optics for semiconductor array color imagers, and the processes, materials systems and structures taught herein are incompatible with semiconductor microelectronic fabrication sequences for semiconductor array cameras. In particular, Ling teaches three alternative methods for forming microlens arrays as curved surfaces in silicon dioxide which he terms a master mold, followed by a secondary mold with an inverted curvature, and, completed with a third mold with the initial curvature of the master mold using conventional methods such as hot press, molding, polymerization, or casting.

SUMMARY OF THE INVENTION

Microlenses can be manufactured by a variety of different methods. The simplest method is to use standard photolithography techniques followed by melting or reflowing photoresist stripes into cylinders, or squares into hemispheres. From the equation: $F=R/(n-1)$ where F is focal length, R is radius, and n is the index of refraction, we know that we have to increase the radius R of the microlens if we want to produce a long focal length in a photoresist of essentially constant refractive index n. Experimental data has shown that we have to decrease the thickness of the photoresist film if we want to form this kind of microlens with bigger radius, associated with the surface physics and rheology of lens formation.

As the surface area of the lens increases, the volume of the lens focusing incident light on the sensing area increases. The design challenge is, therefore, how to get the most surface area of the lens and keep the focal length constrained in the available design window.

It is a principal object of the present invention to provide a manufacturable method and microelectronic fabrication process for making an ideal microlens having optimal focus performance and then overcoating at least one high transmittance film with refractive index near 1.5 on the said formed microlens to adjust the focal length within the available depth of focus design window.

A further object of the print invention is to increase flexibility of the design and layout of semiconductor array color imaging devices. The present invention obviates the need for elenic or optical changes to existing design and allows compensating adaptive adjustment with minimum processing to realize design specifications.

Another object of the present invention is to improve the electro-optic sensitivity and gain value of the long focal length microlens imager, and, provide a solution for super depth focal plane CMOS, CCD, and CID image sensors. Experimental performance comparison has shown that conventional microlens imager sensitivity varies in the order of 2.5 times the pixel fill-factor, while long focal length microlens imagers average 1.8 to 1.9 times the fill-factor, where fill-factor is defined as photodiode sensing area divided by pixel area (size). The high transmittance (>95%) overcoat process of the present invention has been experimentally demonstrated to yield effective gain values for long focal length microlenses of over 2.0 times the pixel fill-factor.

Another object of the present invention is to provide an adaptive process wherein antireflection and image-forming structures, spectral color filters, and, combinations or varying configurations of semiconductor vertical profiles can be integrated with the result of maximizing collection efficiency of image intensity patterns on the photodiode planar arrays to achieve optimum pixel resolution and color signal contrast.

Another object of the present invention is to provide an overcoat process allowing the widest and most forgiving process windows for microlens and semiconductor integration for high reproducibility, high reliability, and, consequently maximum process yield and minimum production cost.

In accordance with the objects of this invention, classes of multi-microlens optical constructs which can be combined with either conventional or novel colorfilter fabrication sequences for CMOS, CCD, or CID array imaging devices are recognized. To practice the method of the present invention, conventional microelectonic fabrication techniques using photolithograhic materials, masks and etch tools are employed: in succession the array of pn-junction photodiodes is patterned with impurity dopants diffused or ion-implanted, isolated, planarized over, and, typically three more layers are built up additively with primary red, green, blue color-filters formed by the addition of suitable dyes or pigments appropriate to the desired spectral transmissivity to be associated with specified photodiode coordinate addresses in the imager matrix. Following photoresist patterning, microlens formation by thermal reflow is completed with the addition of the overcoat layer to create a high transmittance film of appropriate index of refraction over the microlens array.

Single chip color arrays typically use color filters that are aligned with individual columns of detector elements to generate a color video signal. In a typical stripe configuration, green filters are used on every other column with the intermediate columns alternatively selected for red or blue recording. Various combinations and permutations of color-filter sequences or color-filter "masks" are possible, and, a number of microprocessor algorithms exist for balancing color components in the synthetic reconstruction of color images.

BRIEF DESCRIPTION OF THE DRAWINGS

The objects, features and advantages of the present invention are understood within the context of the Description of the Preferred Embodiment, as set forth below. The Description of the Preferred Embodiment is understood within the context of the accompanying drawings, which form a material part of this disclosure, wherein.

DESCRIPTION OF THE PREFERRED EMBODIMENT

The present invention discloses a simple fabrication sequence and the specific optical conditions and materials properties to be satisfied in forming an overcoat of high transmittance material to optimize long focal length microlens arrays for integrated semiconductor array color imaging devices.

Process Flow

Figure 4:
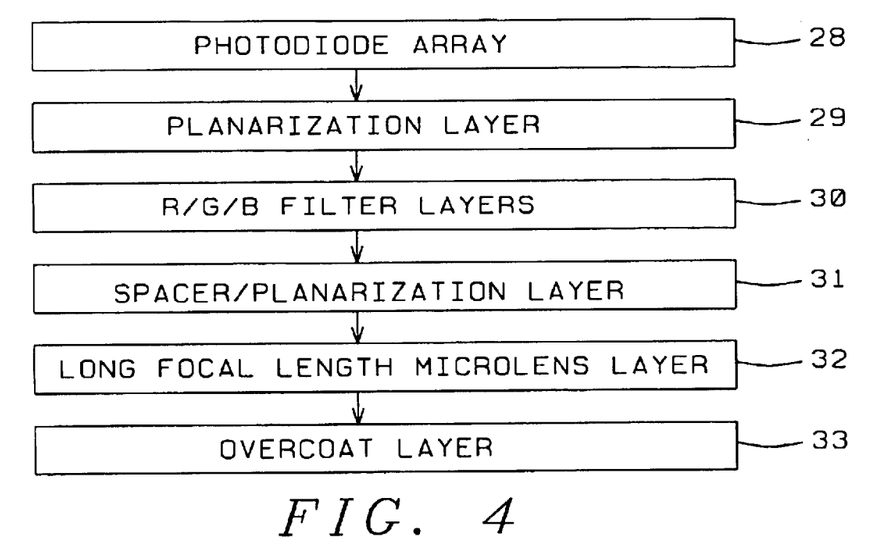
FIG. 4 shows the precedence flow-chart of the process of the present invention.
Figure 12:
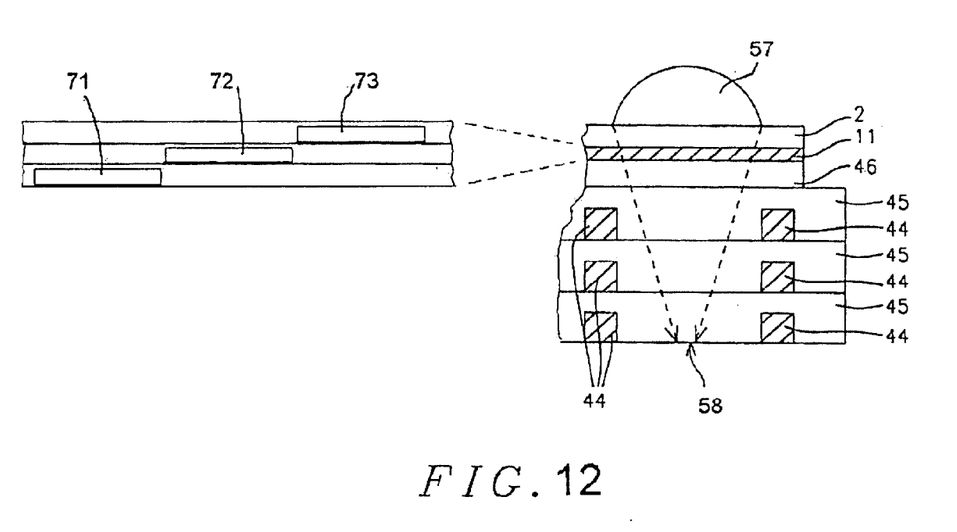
FIG. 12 details the multiple planarized color filter layer.
Figure 13:
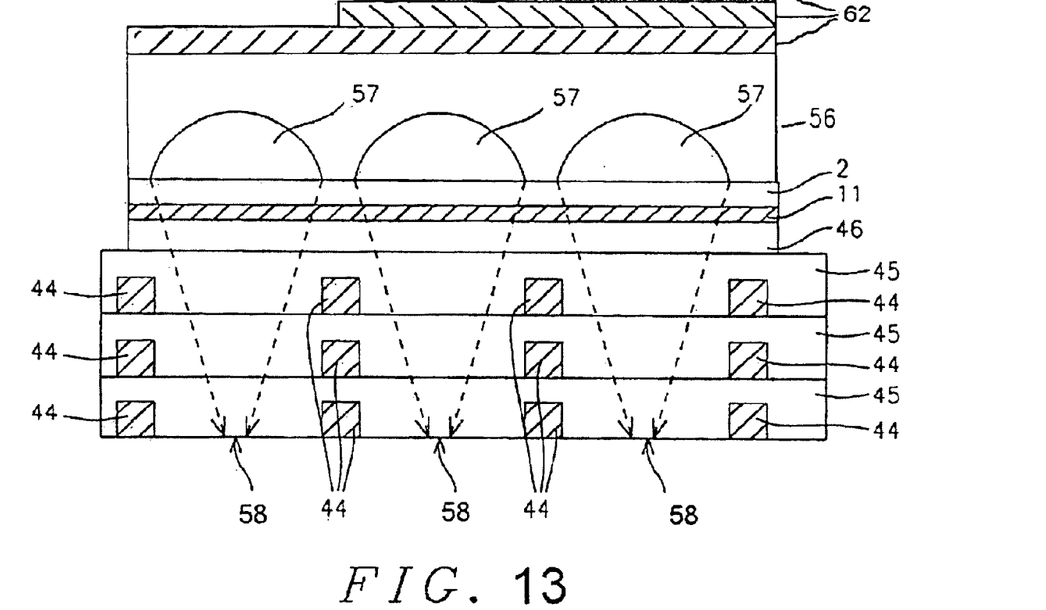
FIG. 13 depicts multiple antireflection layers integrated within the overcoat layer.

FIG. 4 depicts the simplified fabrication flowchart of the process of the present invention, ordered in steps 28 through 33. In step 28 an array of image circuits having photosensitive areas are provided on a semiconductor substrate. In step 29 the array is coated with a transparent layer for passivation purposes which is planarized to accept the fabrication of an optical structure. This layer includes the necessary light shielding layers each with a planarization layer. In step 30 color filter layers are formed. In the preferred embodiment, three color layers are formed as detailed in FIG. 12. In step 31 another planarization (spacer) layer is formed which provides a level surface for the microlens to be formed in step 32. Simple convex lenses are formed. This essentially completes the steps of fabrication utilizing relatively common fabrication and design techniques. A family of imaging devices may be defined for manufacture up to this point. Finally, step 33 requires applying an overcoat layer which is the important aspect of this invention. The application of a high transmittance overcoat serves several purposes including compensating for depth of focus, reducing reflections, providing for further color filtering capability as well as providing protection from the environment.

Basic Optical Structure

Figure 5:
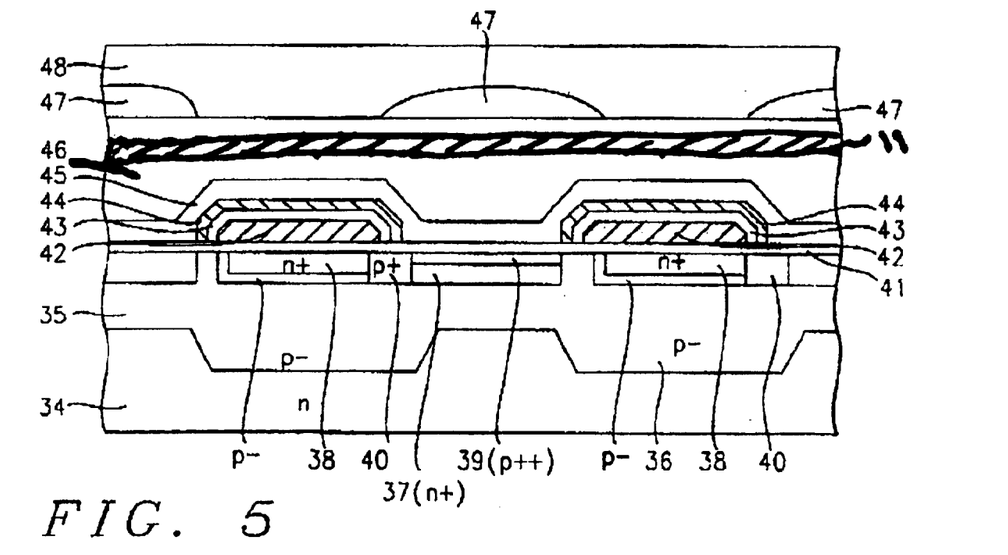
FIG. 5 is a cross-sectional view of a representative semiconductor array color imaging device, exhibiting the vertical profile in a conventional fabrication process.

FIG. 5 depicts the cross-sectional view of one aspect of the preferred embodiment of the present invention, showing in particular the formation of the microlens array and overcoat layer on a CCD device having a single light shielding layer of the solid-state array imager. FIG. 5 does not show a color filter layer or an alternative set of photo shield layers as illustrated in and discussed relative to FIGS. 7-9 and 11-16. FIG. 5 illustrates the case of a CCD imager fabrication sequence, but it is clearly recognized that the present invention equally well applies to charge injection device (CID) imagers and CMOS imagers. In FIG. 5, an "n" (negative) type semiconductor substrate 34, is photolithographically patterned by suitable photoresist coating, masking, exposing and developing, to open regions for ion-implant or diffusion doping by selected impurity atoms to form ff (weakly doped positive) type wells 35 and 36. With similar photolithography steps, ion-implants or diffusions, an n+type region 37 is formed to create a pn-junction photodiode and a vertical charge coupled device 38. A highly doped positive impurity, p++, is introduced selectively to form a surface isolation layer 39, and, a p-type well 40 is formed to isolate the CCD device 38. To isolate pixels, a p+channel stop 40 is formed. The gate insulator 41 is then applied over the surface of the substrate. The vertical profile is completed by photolithographic and photopolymerization processing by ultraviolet or other irradiation to form successive additions of transmission gate 42, interlevel insulator 43, light-shielding layer 44, passivation layer 45, planarization layer 46, microlens army-plane layer 47, and overcoat layer 48.

Color Filter

A color filter layer 11, as depicted in FIGS. 7-9 and 11-16, comprises several layers 71, 72 and 73 that can provide for up to three different specified colors nominally labeled red, green and blue (RIG/B) as shown in fabrication step 30 of FIG. 4. In the case that a particular color imager specification requires fewer than 3 colors, it is expedient to provide a planarized spacer layer in lieu of a color filter in order to maintain consistent optical structure dimensions during fabrication. A single color filter would provide monochrome signal responsive to that color. A single patterned color filter would allow a subset of color pixels to be responsive to that color while the remaining pixels would essentially be monochrome in response. This method allows for consistent fabrication regardless of the combination of color filters specified.

Microlens

Figure 6:
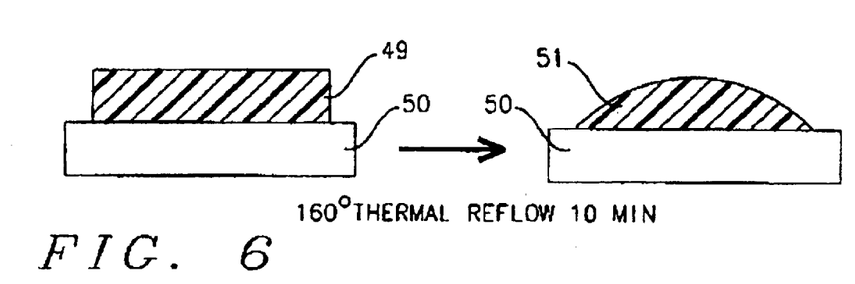
FIG. 6 shows the thermal reflow of photoresist for forming hemispherical micro lens arrays.

FIG. 6 illustrates the microlens forming process. Following the use of a standard photolithography step to pattern an area array of microlens preforms 49 formed on a planarized layer 50, heat is applied to raise the temperature of the photoresist to 160 degrees Centigrade for 10 minutes to induce thermal reflow. Resulting from surface tension, the hemispherical microlens element 51 is formed. Similarly, if the photo pattern consists of stripes, the reflow results in forming hemicylindrical lenses. A patterned exposure to ultraviolet or other irradiation may be used to further polymerize the microlens layer to adjust the final value of refractive index.

Although the preferred embodiment seeks simplicity of fabrication complex microlens structures are possible. The method allows for a structure in which the vertical profile of the semiconductor imaging device, shown in FIG. 11, has a first microlens layer 57 and overcoat 60 and a second microlens layer 61 and overcoat 58, such that the multiple overcoat layers are formed satisfying the optical and material needs. Although the preferred embodiment sees to utilize conventional fabrication techniques, it does not preclude formation of other lens shapes including but not limited to compound hemispherical convex, planoconvex, hemicylindrical, aspheric, holographic, Fresnel, Conic sections, such as illustrated in FIGS. 3 a, b and c.

Short Focal Length

Figure 7:
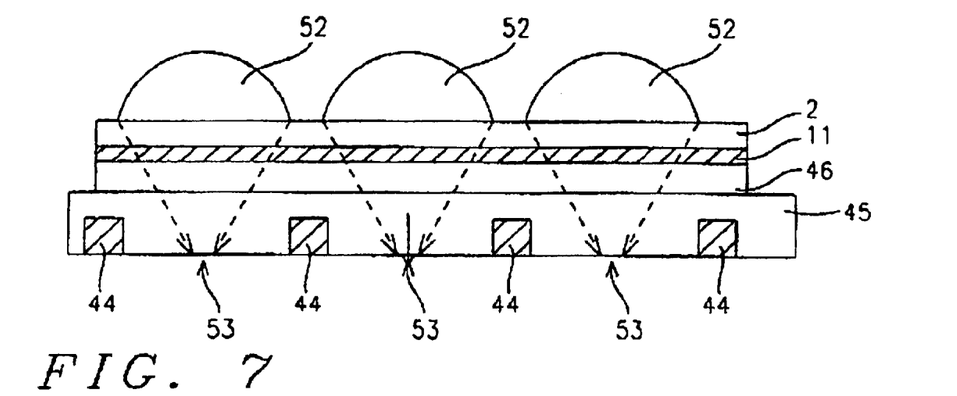
FIG. 7 is a representation of image formation by a short focal length microlens.

FIG. 7 exhibits a color pixel imager cross-section with a short focal length microlens 52 focused onto a focal area 53 inscribed within the active region of the photodiodes. Typical for CMOS imagers, short focal lengths may be of the order of 8 microns for a 0.5 to 0.8 micron feature size. Microlens 52 has a distinctly tall and spherical profile sharply focusing a cone of light rays toward photosensitive area 53. FIG. 7 does not show the image circuit elements as illustrated in FIG. 5. The passivation layer 45, a planarization layer 46, a set of color filter layers 11 and a planarization layer 2 are illustrated.

Microlens Interfaces

Figure 10:
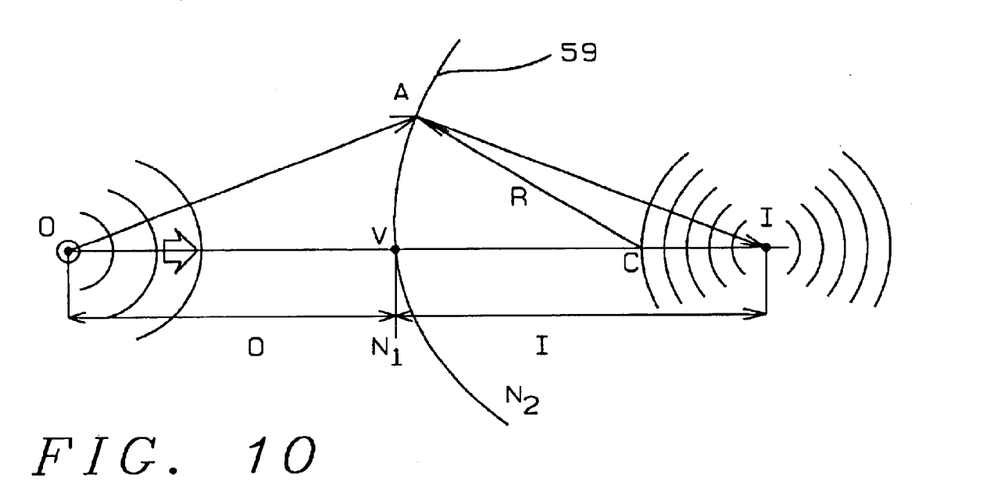
FIG. 10 discloses the optical conditions for optimization of long focal length microlenses.
Figure 11:
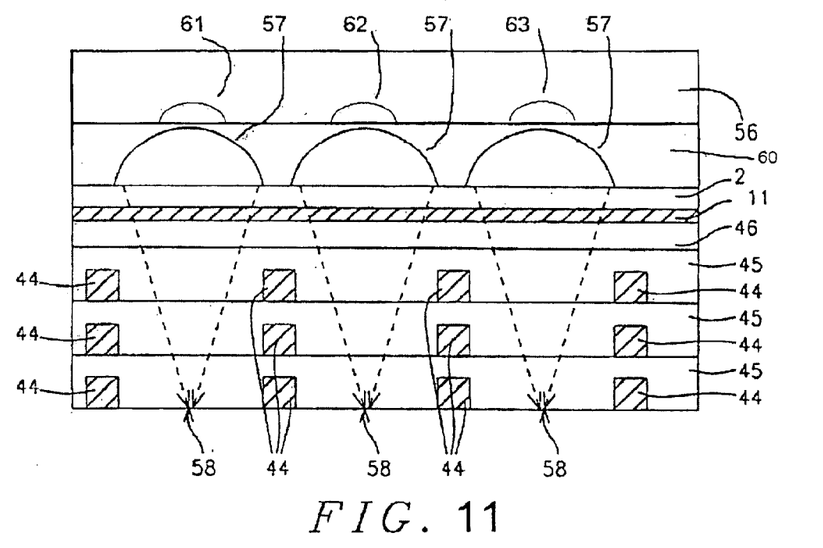
FIG. 11 depicts multiple overcoat layers in conjunction with complex microlenses.

Precise spherical surfaces are particularly easy to fabricate because the spherical shape represents a minimum in surface energy, occurring when the surface tension effect naturally forms the microlens during the photoresist melt and reflow process. FIG. 10 depicts a microlens spherical boundary surface 59 of radius R centered at point C. In FIG. 10, an object or point light source at an object distance O from the vertex V along the axis of the microlens will refractively converge a cone of light rays to an image at image distance I from point V. If the index of refraction in the space between the object light source is N1 and the index in the space inside the lens (to the right of the spherical lens surface in FIG. 10) is N2, then spherical wave fronts ail converge to a real image at I. Using the well-known Format's Principle, it can be shown that for spherical refracting surfaces:

$$N1/O + N2/I = (N2 - N1)/R \text{ and,}$$

that when O is very large, the image focal length is then given by, $$Fi = R(N2 - N1).$$

Thus, if we can make the index of refraction N1 of the overcoat layer approach a close match to the microlens index of one fraction N2, the value in the denominator (N2-N1) gets very small, and, for fixed radius of curvature R of the microlens, the focal length Fi becomes long. In this manner, the overcoat layer material can be adjusted to optimize the microlens performance. Since depth of focus will shrink as the square of the numerical aperture of the microlens, the overcoat layer can adjust the balance to practical values of the numerical aperture to contain the depth of focus to within the designer's window for color-gain balance, spectral resolution, signal contrast or signal-to-noise ratio specifications.

Long Focal Length

Figure 8:
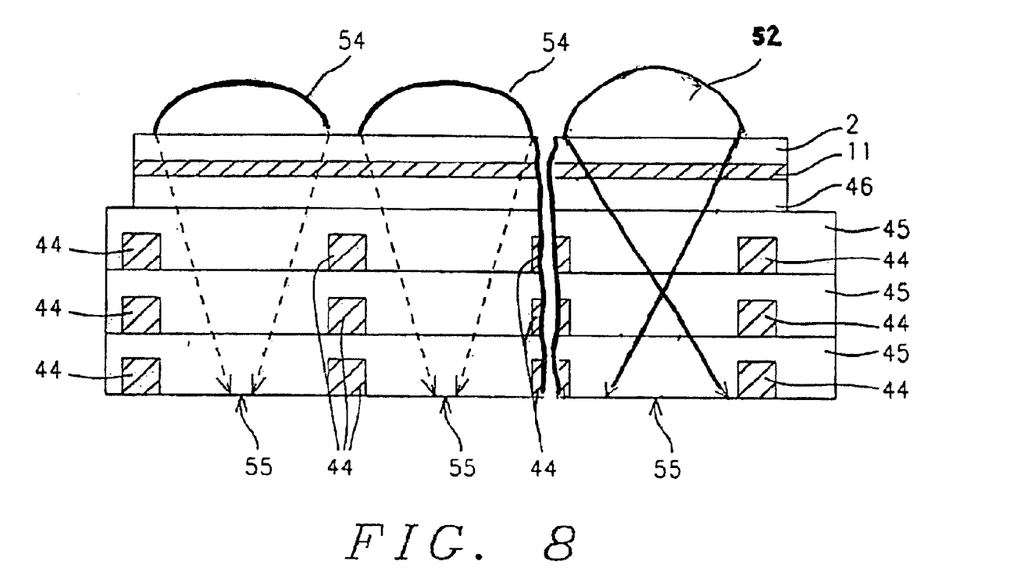
FIG. 8 is a representation of image formation by a long focal length microlens.

For CMOS imagers with typical feature sizes of 0.25 to 0.35 microns with multiple light shielding levels, long focal lengths are required, as shown in FIG. 8. The light shields 44 are integrated with passivation layer 45 in a similar manner as introduced in FIG. 5 with a light shield formed and then covered with a passivation layer 45. Several integrated layers are thus formed. In FIG. 8, the micro-lens 54 thickness is distinctly smaller and the radius of curvature is distinctly larger than those of microlens 52 in FIG. 7. A comparison is given in FIG. 8 shown a the position of the focal point in each case. The extreme light rays defined by the microlens clear aperture illustrate the focal cone half-angle comparison between the focal cones formed by the short focal length microlens 52 and the long focal length microlens 54 converging to focal area 55.

Overcoat Layer

Figure 9:
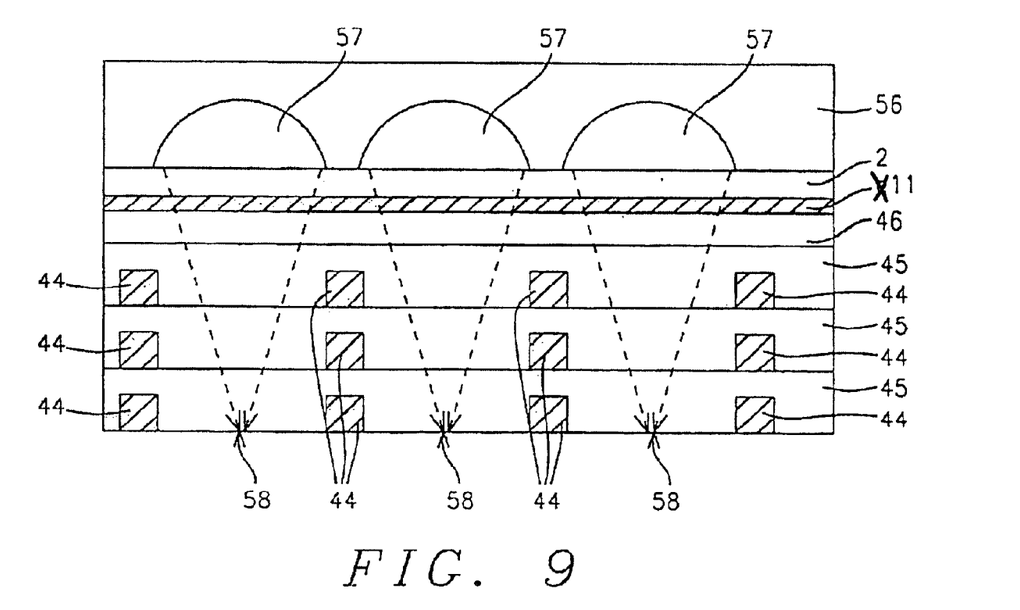
FIG. 9 contrasts the microlens' curvature of FIG. 8 when the overcoat layer is applied.

With the addition of the overcoat layer formed in accord with the optical and materials properties specified in the present invention, FIG. 9 further contrasts the thickness and curvature of the microlens of FIG. 8. Microlens 57 can be of similar profile as that of microlens 52. With similar profile lenses used in short and long focal length designs the art of fabrication is made simpler. In FIG. 9, overcoat layer 56 transforms the unity refractive index, n=1.0, air-microlens interface of FIG. 8 into the index-matched, n=1.5, overcoat-microlens 57 interface. In FIG. 9, focal area 58 resides on the plane of the photo sensor array, and, ideally represents the median of the focal depth window.

In accord with the process flow chart shown in FIG. 4, the manufacturing method of the present invention teaches formation of a long focal length microlens with an overcoat layer comprised of negative photoresist or other materials satisfying at least the following three specific conditions: (1)>95% (high) transmittance, (2) thermal resistance>270 degrees Centergrade, (3) index of refraction, n=1.5 it is further specified that the overcoat layer thickness must be sufficient to have an essentially flat top surface presented to the incident light it is also advantageous to select the overcoat layer 56 thickness in integral multiples of an average visible quarter-wavelength of light to satisfy anti-reflection coating conditions to minimize reflection loss at the air-overcoat interface where image light is incident.

In the final fabrication step, adjustments of the thickness and/or index of refraction of the overcoat layer are made to modify the focal length and depth of focus of the microlens array. The overcoat layer is exposed to ultraviolet or other irradiation to photopolymerize the material comprising the overcoat. By theoretically calculating and experimentally calibrating the irradiance dosage, adjustments in irradiation energy and exposure time enable tailoring the index of refraction, polarizing properties, and spectral absorption characteristics of the overcoat layer; said polymerization process serves the additional function of cross-linking molecules to assure a stable dimensional control value for the overcoat layer thickness.

Negative Photoresist

The present invention further distinguishes and recognizes that the formation of a microlens array from positive photoresist renders the microlens susceptible to damage from chemical and thermal treatments inherent in microelectronic processing when formed at a surface, To create a thermal barrier and protective encapsulate for a microlens layer, the overcoat layer is preferably comprised of a negative type photoresist. The present invention similarly recognizes the existence of the benefit of employing negative photoresist material for the high transmittance coating layer with refractive index that is closely matched at interfaces so that less light is reflected, scattered, or "lost" at layer boundaries.

Selective Adjustment to the Optical Structure

The thickness of the encapsulating planarizing layer can be made equal to an integral multiple of a quarter-wavelength of the spectral-average of the wavelengths comprising the incident image light, enabling the encapsulating planarizing layer to have the property of antireflection. Shown in FIG. 13, the planarizing encapsulate can be comprised of a patterned multilayer stack 62 such that one or more color (interference) filters are thereby integrated within the planarizing overcoat.

Figure 14:
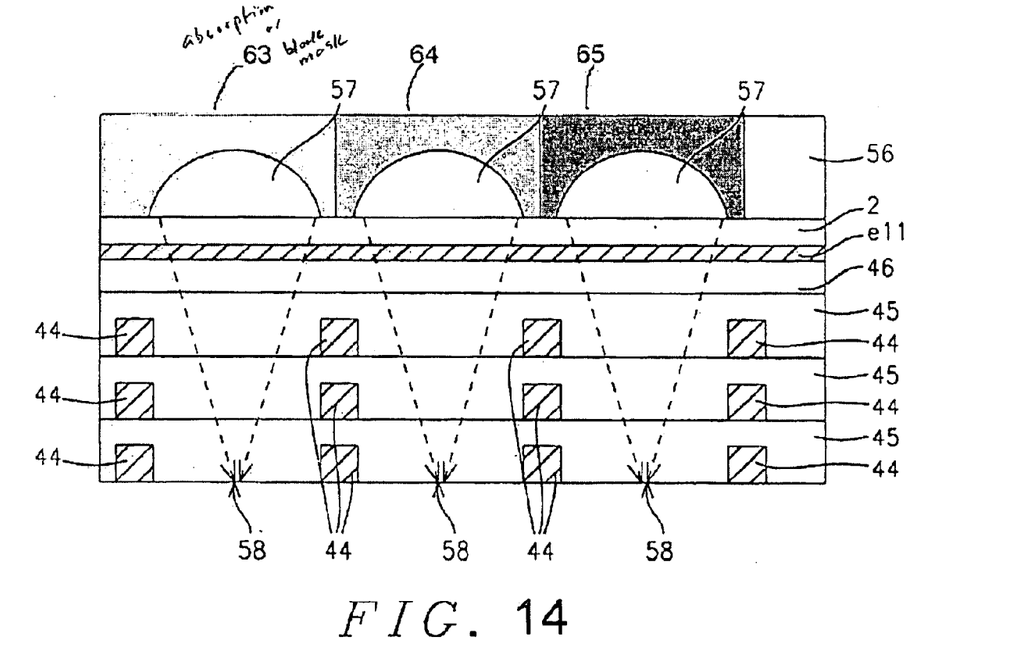
FIG. 14 illustrates the microlens overcoat formed a blocking masks.

Imaging device performance demands may require attenuation in particular spectra. This is preferably accomplished as dose as possible to the imaging source. FIG. 14 depicts an overcoat layer having intervening absorption or block masks 63, 64 and 65 formed in a pattern in mutual registration with one or more subsets of elements in th microlens array, color filter arrays, or photodiode array by ultraviolet or other irradiation. This in-line process provides final fabrication adjustment for the resulting patterned overcoat which, in turn, provides analog attenuators for precompensation of color gain-balance of semiconductor imaging devices.

Figure 15:
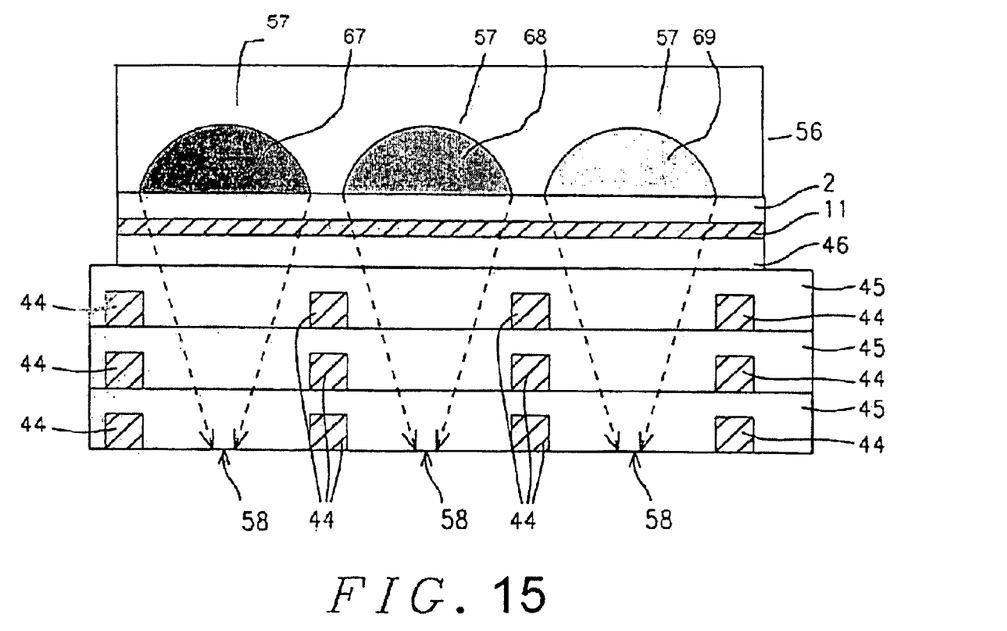
FIG. 15 depicts the microlenses having different indices of refraction.
Figure 16:
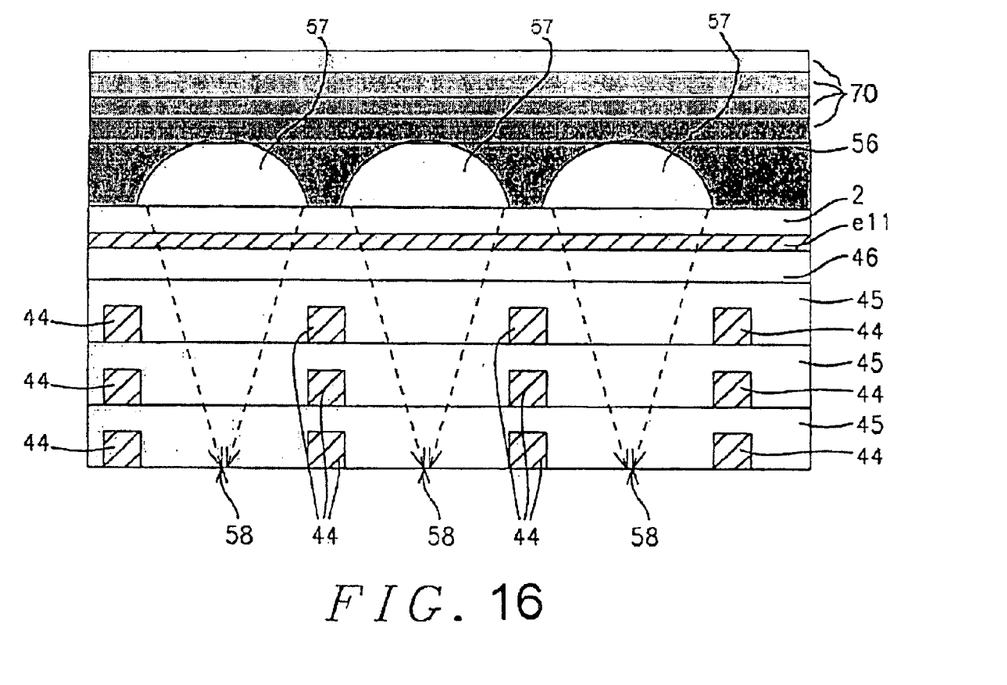
FIG. 16 illustrates the overcoat layer as having graded index of refraction.

Likewise ultraviolet or other irradiation, including thermal processes, can be applied to the microlens layer in either a patterned or uniform array structure to increase the refractive index at a fixed radius of curvature in order to tune the focal length of the microlens-overcoat optical system. FIG. 15 portrays different index of refraction 67, 68 and 69 in microlenses 57 after patterned irradiation.

The method allows for a graded refractive index within the overcoat. The overcoat layer, shown in FIG. 16, can be formed over the microlens array-plane to provide a graded refractive index profile 70 beginning at the 90 air-overcoat interface with a value close to the refractive index n=1.0 of air, and, continuously increasing in a gradient up to the refractive index of the microlens material, e.g., n=1.5, at the overcoat microlens interface, minimizing interfacial reflection losses ewhile optimizing long focal length microlens performance.

The method additionally allows for refractive index gradation of any and all internal planarization, passivation or spacer layers to satisfy the boundary conditions that each and every interface is index-matched, minimizing interfacial reflection losses while optimizing transmittance of the imaging light to the collecting photosensors.

Advantages

The overcoat layer provides, therefore, an analog means to avoid electronic signal processing circuit or amplifier redesign, and, provides latitude in engineering design margins. Relief of thickness process control for microlens fabrication is afforded by the easier, more precise control of the overcoat layer, Since the microlens is fabricated over many process layers, including planarization and spacers, tolerances which sum up during the process can be compensated by the overcoat layer thickness and refractive index adjustment to minimize rework or loss, and, maximize final process yield in semiconductor color image devices.

What is claimed is:

1. A method of fabricating a semiconductor color imager having an optical structure wherein an overcoat layer is adapted for optimizing long focal length microlens performance in an ordered process sequence comprising:

a semiconductor substrate having a matrix of imaging sensors formed thereon each imaging sensor having a photosensitive area and a complementary non-photosensitive area, said matrix of imaging sensors being organized in a plurality of subsets;

forming a matrix of light shields over the non-photosensitive areas of the matrix of imaging sensors;

forming a first passivation layer over the matrix of imaging sensors;

forming a first optically transparent planarization layer over the first passivation layer over the matrix of imaging sensors;

forming a first patterned color filter layer on the first optically transparent planarization layer, said first patterned color filter layer being registered with the photosensitive areas of a first subset of the matrix of imaging sensors;

forming upon the first patterned color filter layer a second planarizing and/or patterned color filter layer in mutual registration with the first color filter layer and a with subset of photosensitive areas (color pixels);

forming upon the second planarizing and/or color filter layer a third planarizing and/or color filter layer in mutual registration with the first end second color filter layers and a subset of photosensitive areas (color pixels);

patterning a layer of microlens material to form a first matrix of microlenses over the third planarizing and/or color filter layer, said first matrix of microlenses being mutually registered with the photosensitive areas in the matrix of imaging sensors;

forming an overcoat layer over the first matrix of microlenses, said overcoat layer having high transmittance, said overcoat layer providing patterned or uniform optical compensation between the subsets of the matrix of the imaging sensors;

whereby said optical structure provides flexibility in design and optimized performance in a single color or a muiltiple color semiconductor imager.

2. The method of claim 1, wherein:
the semiconductor substrate material may be selected from the group consisting of periodic table IV, III-V, II-VI, or other simple or compound semiconductors.

3. The method of claim 1, wherein:
the matrix of imaging sensors comprise CMOS, CCD, or CID semiconductor sensors.

4. The method of claim 1, wherein:
the overcoat layer is comprised of a negative type photoresist having retractive index adjusted to match the retractive index of the microlens material, nominally at n=1.5.

5. The method of claim 1, wherein:
the overcoat layer is comprised of a patterned multilayer stack such that one or more color (interference) filters are thereby integrated with the overcoat material.

6. The method of claim 1, wherein:
the elements of the first matrix of microlenses may be selected from the group consisting of simple hemispherical convex, plano-convex, hemicylindrical, aspheric, holographic, Fresnel, conic sections, or combinations of known lens classes.

7. The method of claim 1, wherein:
the microlens layer material is selected from the group of positive or negative conventional photolithographic materials.

8. The method of claim 7, wherein:
the overcoat layer is comprised of a negative type photoresist to serve as a thermal barrier and protective encapsulate for a microlens layer material comprising a positive type photoresist.

9. The method of claim 1, wherein:
the microlens focal length and depth of focus is adjusted by controlling the thickness and refractive index in the final fabrication step of the color imager.

10. The method of claim 1, wherein:
the first matrix of microlenses is exposed to ultraviolet or other irradiation, including thermal processes, to further polymerize the microlens layer material to increase the refractive index at a fixed radius of curvature, to tune the focal length of the microlens-overcoat optical structure.

11. The method of claim 1, wherein:
the overcoat is comprised of a material satisfying at least the following three requirements;
(1) of index of refraction matched to that of the index of refraction of the microlenses, e.g., n=1.5.
(2) thermal resistance >270 degrees Centigrade, 85
(3) transmittance >95%.

12. The method of claim 1 wherein:
a second matrix of light shields together with a second passivation layer is formed upon the first passivation layer and below the first optically transparent planarization layer, said second matrix of light shields being registered with the first matrix of light shields.

13. The method of claim 12 wherein:
a third matrix of light shields together with a third passivation layer is formed on the second planarized-matrix of light shields and below the first optically transparent planarization layer said third matrix of light shields being registered with the matrix of light shields.

14. The method of claim 1, wherein:
the first matrix of microlenses is exposed to an ultraviolet or other irradiation pattern to further polymerize a subset of the first microlens matrix to increase the refractive index at a fixed radius of curvature, to optically tune a subset of the optical structure.

15. The method of claim 1, wherein:
a layer of microlens material is patterned to form a second matrix of microlenses over the first matrix of microlenses and beneath the overcoat layer, said second matrix of microlenses having a high transmittance undercoat, said second matrix of microlenses being registered with the first matrix of microlenses whereby a compound microlens structure and undercoat/overcoat layers are formed to satisfy optical specification and performance.

16. The method of claim 15, wherein:
the elements of the first and second matrix of microlenses may be selected from the group consisting of compound hemispherical convex, plano-convex, hemicylindrical, aspheric, holographic, Fresnel, conic sections, or combinations of known lens classes.

17. The method of claim 1, wherein:
the overcoat layer is exposed to calibrated dosages of ultraviolet or other irradiation to photopolymerize the high transmittance overcoat material whereby the index of refraction, polarizing properties, spectral absorption characteristics are tailored and the overcoat material molecules are cross-linked to provide thickness control.

18. The method of claim 1 wherein:
the overcoat is exposed to a masked pattern of ultraviolet or other irradiation to form a matrix areas within the overcoat with adjusted properties, said masked pattern being registered with on or more subsets of the matrix of the imaging sensors, whereby imaging sensor subset gain-balance and attenuation is provided.

* * * * *

UNITED STATES PATENT AND TRADEMARK OFFICE
CERTIFICATE OF CORRECTION

PATENT NO.    : 6,821,810 B1
DATED         : November 23, 2004
INVENTOR(S)   : Yu-Kung Hsiao et al.

It is certified that error appears in the above-identified patent and that said Letters Patent is hereby corrected as shown below:

Title page,
Item [75], Inventors, please delete "Bii-Juno" and insert -- Bii-Junq --.

Column 10,
Line 57, please delete claim 1 in its entirety and insert the following:

--1. A method of fabricating a semiconductor color imager having an optical structure wherein an overcoat layer is adapted for optimizing long focal length microlens performance in an ordered process sequence comprising:

a semiconductor substrate having a matrix of imaging sensors formed thereon, each imaging sensor having a photosensitive area and a complementary non-photosensitive area, said matrix of imaging sensors being organized in a plurality of subsets;

forming a first matrix of light shields over the non-photosensitive areas of the matrix of imaging sensors;

forming a first passivation layer;

forming a first optically transparent planarization layer over the first passivation layer;

forming a first patterned color filter layer on the first optically transparent planarization layer, said first patterned color filter layer being registered with the photosensitive areas of a first subset of the matrix of imaging sensors;

forming upon the first patterned color filter layer a second planarized layer, said second planarized layer comprising either a planarized spacer layer or a second color filter layer, said second color filter layer being in mutual registration with a second subset of photosensitive areas (color pixels);

forming upon the second planarized layer, a third planarized layer, said third planarized layer comprising either a planarized spacer layer or a third color filter layer, said third color filter layer being in mutual registration with a third subset of photosensitive areas (color pixels);

patterning a layer of microlens material to form a first matrix of microlenses over the third planarized layer, said first matrix of microlenses being mutually registered with the photosensitive areas in the matrix of imaging sensors;

forming an overcoat layer over the first matrix of microlenses, said overcoat layer having high transmittance, said overcoat layer providing patterned or uniform optical compensation between the subsets of the matrix of the imaging sensors;

whereby said optical structure provides flexibility in design and optimized performance in a single color or a multiple color semiconductor imager.--

UNITED STATES PATENT AND TRADEMARK OFFICE
CERTIFICATE OF CORRECTION

PATENT NO. : 6,821,810 B1
DATED : November 23, 2004
INVENTOR(S) : Yu-Kung Hsiao et al.

It is certified that error appears in the above-identified patent and that said Letters Patent is hereby corrected as shown below:

Column 12
Line 35, delete claim 15 in its entirety and insert the following:

--15. A method of fabricating a semiconductor color imager having an optical structure wherein an overcoat layer is adapted for optimizing long focal length microlens performance in an ordered process sequence comprising:

a semiconductor substrate having a matrix of imaging sensors formed thereon, each imaging sensor having a photosensitive area and a complementary non-photosensitive area, said matrix of imaging sensors being organized in a plurality of subsets:

forming a first matrix of light shields over the non-photosensitive areas of the matrix of imaging sensors;

forming a first passivation layer;

forming a first optically transparent planarization layer over the first passivation layer;

forming a first patterned color filter layer on the first optically transparent planarization layer, said first patterned color filter layer being registered with the photosensitive areas of a first subset of the matrix of imaging sensors;

forming upon the first patterned color filter layer a second planarized layer, said second planarized layer comprising either a planarized spacer layer of a second color filter layer, said second color filter layer being in mutual registration with a second subset of photosensitive areas (color pixels);

forming upon the second planarized layer a third planarized layer, said third planarized layer comprising either a planarized spacer layer or a third color filter layer, said third color filter layer being in mutual registration with a third subset of photosensitive areas (color pixels);

patterning a layer of microlens material to form a first matrix of microlenses over the third planarized layer, said first matrix of microlenses being mutually registered with the photosensitive areas in the matrix of imaging sensors;

forming an undercoat layer over the first matrix of micro lenses, said undercoat layer having high transmittance;

patterning a layer of microlens material to form a second matrix of microlenses over the undercoat layer, said second matrix of micro lenses being registered with the first matrix of micro lenses whereby a compound microlens structure is formed;

forming an overcoat layer over the second matrix of microlenses, said overcoat layer having high transmittance, said overcoat layer providing patterned or uniform optical compensation between the subsets of the matrix of the imaging sensors;

UNITED STATES PATENT AND TRADEMARK OFFICE
CERTIFICATE OF CORRECTION

PATENT NO.      : 6,821,810 B1
DATED           : November 23, 2004
INVENTOR(S)     : Yu-Kung Hsiao et al.

It is certified that error appears in the above-identified patent and that said Letters Patent is hereby corrected as shown below:

Column 12, (cont'd),
Line 52, delete claim 17 in its entirety and insert the following:

17. --A method of fabricating a semiconductor color imager having an optical structure wherein an overcoat layer is adapted for optimizing long focal length microlens performance in an ordered process sequence comprising:

a semiconductor substrate having a matrix of imaging sensors formed thereon, each imaging sensor having a photosensitive area and a complementary non-photosensitive area, said matrix of imaging sensors being organized in a plurality of subsets;

forming a first matrix of light shields over the non-photosensitive areas of the matrix of imaging sensors;

forming a first passivation layer;

forming a first optically transparent planarization layer over the first passivation layer;

forming a first patterned color filter layer on the first optically transparent planarization layer, said first patterned color filter layer being registered with the photosensitive areas of a first subset of the matrix of imaging sensors;

forming upon the first patterned color filter layer a second planarized layer, said second planarized layer comprising either a planarized spacer layer or a second color filter layer, said second color filter layer being in mutual registration with a second subset of photosensitive areas (color pixels);

forming upon the second planarized layer a third planarized layer, said third planarized layer comprising either a planarized spacer layer or a third color filter layer, said third color filter layer being in mutual registration with a third subset of photosensitive areas (color pixels);

patterning a layer of microlens material to form a first matrix of microlenses over the third planarized layer, said first matrix of microlenses being mutually registered with the photosensitive areas in the matrix of imaging sensors;

forming an overcoat layer over the first matrix of microlenses, said overcoat layer having high transmittance, said overcoat layer providing patterned or uniform optical compensation between the subsets of the matrix of the imaging sensors;

wherein said overcoat layer is exposed to calibrated dosages of ultraviolet or other irradiation to photopolymerize the high transmittance overcoat material whereby the index of refraction, polarizing properties, spectral absorption characteristics are tailored and the overcoat material molecules are cross-linked to provide thickness control.--

UNITED STATES PATENT AND TRADEMARK OFFICE
CERTIFICATE OF CORRECTION

PATENT NO. : 6,821,810 B1
DATED : November 23, 2004
INVENTOR(S) : Yu-Kung Hsiao et al.

It is certified that error appears in the above-identified patent and that said Letters Patent is hereby corrected as shown below:

Column 12, (cont'd),
Line 59, delete claim 18 in its entirety and insert the following:

18. --A method of fabricating a semiconductor color imager having an optical structure wherein an overcoat layer is adapted, for optimizing long focal length microlens performance in an ordered process sequence comprising:

a semiconductor substrate having a matrix of imaging sensors formed thereon, each imaging sensor having a photosensitive area and a complementary non-photosensitive area, said matrix of imaging sensors being organized in a plurality of subsets;

forming a first matrix of light shields over the non-photosensitive areas of the matrix of imaging sensors;

forming a first passivation layer;

forming a first optically transparent planarization layer over the first passivation layer;

forming a first patterned color filter layer on the first optically transparent planarization layer, said first patterned color filter layer being registered with the photosensitive areas of a first subset of the matrix of imaging sensors;

forming upon the first patterned color filter layer a second planarized layer, said second planarized layer comprising either a planarized spacer layer or a second color filter layer, said second color filter layer being in mutual registration with a second subset of photosensitive areas (color pixels);

forming upon the second planarized layer a third planarized layer, said third planarized layer comprising either a planarized spacer layer or a third color filter layer, said third color filter layer being in mutual registration with a third subset of photosensitive areas (color pixels);

patterning a layer of microlens material to form a first matrix of microlenses over the third planarized layer, said first matrix of microlenses being mutually registered with the photosensitive areas in the matrix of imaging sensors;

forming an overcoat layer over the first matrix of microlenses, said overcoat layer having high transmittance, said overcoat layer providing patterned optical compensation between the subsets of the matrix of the imaging sensors;

wherein the overcoat is exposed to a masked pattern of ultraviolet or other irradiation to form a matrix areas within the overcoat with adjusted properties, said masked pattern being registered with one or more subsets of the matrix of the imaging sensors, whereby imaging sensor subset gain-balance and attenuation is provided.-- forming a first optically transparent planarization layer over the first passivation layer;

Signed and Sealed this

Seventeenth Day of May, 2005

JON W. DUDAS
*Director of the United States Patent and Trademark Office*